(12) United States Patent
Liao

(10) Patent No.: US 10,629,634 B1
(45) Date of Patent: Apr. 21, 2020

(54) PIXEL ARRAY SUBSTRATE

(71) Applicant: Au Optronics Corporation, Hsinchu (TW)

(72) Inventor: Bo-Xuan Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/457,933

(22) Filed: Jun. 29, 2019

Related U.S. Application Data

(60) Provisional application No. 62/775,469, filed on Dec. 5, 2018.

(30) Foreign Application Priority Data

Jan. 31, 2019 (TW) .............................. 108103824 A

(51) Int. Cl.
| | | |
|---|---|---|
| *H01L 27/12* | (2006.01) | |
| *G02F 1/1362* | (2006.01) | |
| *G02F 1/1368* | (2006.01) | |
| *G02F 1/1343* | (2006.01) | |

(52) U.S. Cl.
CPC .......... *H01L 27/124* (2013.01); *G02F 1/1362* (2013.01); *G02F 1/1368* (2013.01); *G02F 1/134336* (2013.01); *G02F 1/136204* (2013.01)

(58) Field of Classification Search
CPC ... H01L 27/124; G02F 1/1362; G02F 1/1368; G02F 1/136204; G02F 1/134336
See application file for complete search history.

(56) References Cited

U.S. PATENT DOCUMENTS

| | | | | |
|---|---|---|---|---|
| 9,507,199 | B2 * | 11/2016 | Yanagisawa | ...... G02F 1/133512 |
| 9,871,084 | B2 * | 1/2018 | Liao | ...... H01L 27/323 |
| 10,162,460 | B2 * | 12/2018 | Huang | ...... G06F 3/0416 |

FOREIGN PATENT DOCUMENTS

| | | |
|---|---|---|
| CN | 102183860 | 9/2011 |
| CN | 106647071 | 5/2017 |
| CN | 107065333 | 8/2017 |
| CN | 107123634 | 9/2017 |

* cited by examiner

*Primary Examiner* — Jose R Diaz
(74) *Attorney, Agent, or Firm* — JCIPRNET

(57) ABSTRACT

A pixel array substrate includes signal lines arranged in an arranging direction, pixel structures electrically connected to the signal lines, a driving element and fan-out traces. Each of the fan-out traces is electrically connected to one of the signal lines and the driving element. A fan-out trace group includes a first fan-out trace and a second fan-out trace. A main portion of the first fan-out trace extends in a first direction, and the first direction and the arranging direction have a first angle α therebetween. A main portion of the second fan-out trace extends in a second direction, and the second direction and the arranging direction have a second angle β therebetween. The first angle α is different from the second angle β. In addition, another pixel array substrate has also been proposed.

16 Claims, 7 Drawing Sheets

US 10,629,634 B1

PIXEL ARRAY SUBSTRATE

CROSS-REFERENCE TO RELATED APPLICATION

This application claims the priority benefit of U.S. provisional application Ser. No. 62/775,469, filed on Dec. 5, 2018, and Taiwan application serial no. 108103824, filed on Jan. 31, 2019. The entirety of each of the above-mentioned patent applications is hereby incorporated by reference herein and made a part of this specification.

BACKGROUND

Technical Field

The disclosure relates to a substrate, and more particularly to a pixel array substrate.

Related Art

As display technology develops and becomes widespread, consumers not only demand display panels with high resolution, high contrast, high color saturation and wide viewing angle, but also demand that the display panels have an attractive appearance. For example, consumers wish that the display panels have a slim border or even no border. In general, a plurality of signal lines disposed on an active area of a display panel need to be electrically connected to a driving element of the display panel through a plurality of fan-out traces disposed on a border (or peripheral area) of the display panel. When the display panel has high resolution, there are numerous signal lines, and these numerous signal lines require numerous fan-out traces in order to be electrically connected to the driving element of the display panel. However, when there are numerous fan-out traces, it is not easy to reduce the width of the border of the display panel. In addition, when there are numerous fan-out traces, a covering effect of the fan-out traces may result in an excessively low amount of light received by a sealant of the display panel such that the sealant cannot be fully cured.

SUMMARY

The disclosure provides a pixel array substrate, and a display panel including the pixel array substrate has a slim border, a low parasitic capacitance and a high sealant curing rate simultaneously.

A pixel array substrate of the disclosure includes a substrate, a sealant, a plurality of signal lines, a plurality of pixel structures, a driving element and a plurality of fan-out traces. The substrate has a first area and a second area outside the first area. The sealant is disposed on the substrate, wherein the first area is located within a vertical projection of the sealant on the substrate, and the second area is located on and outside the vertical projection of the sealant on the substrate. The signal lines are disposed on the first area of the substrate, wherein at least some of the signal lines are arranged in an arranging direction. The pixel structures are disposed on the first area of the substrate and electrically connected to the signal lines. The driving element is disposed on the second area of the substrate. Each of the fan-out traces is electrically connected to one of the signal lines and the driving element. The fan-out traces include at least one fan-out trace group. Each of the at least one fan-out trace group includes a first fan-out trace and a second fan-out trace. The first fan-out trace has a main portion, and the second fan-out trace has a main portion, wherein at least a portion of the main portion of the first fan-out trace and at least a portion of the main portion of the second fan-out trace are located in the second area and partially overlap. The main portion of the first fan-out trace extends in a first direction having a first angle α with respect to the arranging direction, the main portion of the second fan-out trace extends in a second direction having a second angle β with respect to the arranging direction, and the first angle α is different from the second angle β.

Another pixel array substrate of the disclosure includes a substrate, a plurality of signal lines, a plurality of pixel structures, a driving element and a plurality of fan-out traces. The signal lines are disposed on the substrate, at least some of the signal lines being arranged in an arranging direction. The pixel structures are electrically connected to the signal lines. The driving element is disposed on the substrate. Each of the fan-out traces is electrically connected to one of the signal lines and the driving element. The fan-out traces include a plurality of fan-out trace groups. Each of the fan-out trace groups includes a first fan-out trace and a second fan-out trace. The first fan-out trace has a first portion and a second portion, and the second fan-out trace has a first portion and a second portion, wherein the first portion of the first fan-out trace overlaps the first portion of the second fan-out trace, and a vertical projection of the second portion of the first fan-out trace on the substrate and a vertical projection of the second portion of the second fan-out trace on the substrate have a gap therebetween. The first portion of the first fan-out trace and the second portion of the first fan-out trace have a junction point therebetween. At least a portion of a line connecting the junction points of the first fan-out traces of the fan-out trace groups is not parallel to the arranging direction.

To make the above features and advantages of the disclosure more comprehensible, examples accompanied with drawings are described in detail as follows.

DESCRIPTION OF THE EMBODIMENTS

Figure 1A:
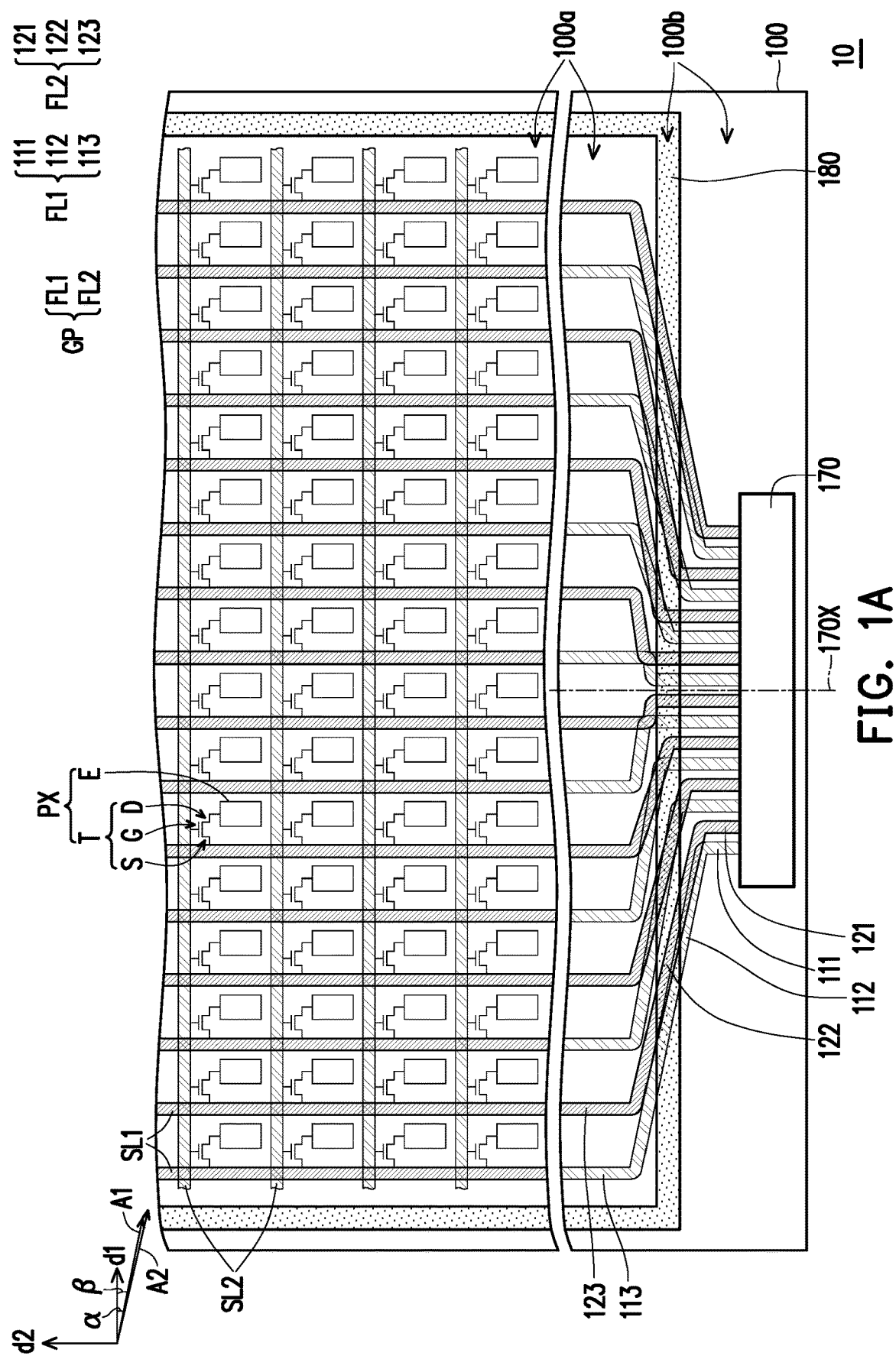
FIG. 1A is a schematic top view of a pixel array substrate according to a first embodiment of the disclosure.

Reference will now be made in detail to exemplary embodiments of the disclosure, examples of which are illustrated in the accompanying drawings. Wherever possible, the same reference numerals are used in the drawings and the description to refer to the same or like parts.

It will be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Moreover, "electrically connected" or "coupled" can encompass the presence of other elements between two elements.

The term "about," "approximately" or "substantially" as used herein is inclusive of the stated value and means within an acceptable range of deviation for the particular value as determined by those of ordinary skill in the art, considering the measurement in question and the error associated with measurement of the particular quantity (i.e., the limitations of the measurement system). For example, "about" may mean within one or more standard deviations, or within ±30%, ±20%, ±10%, ±5% of the stated value. Moreover, a relatively acceptable range of deviation or standard deviation may be chosen for the term "about," "approximately" or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1B:
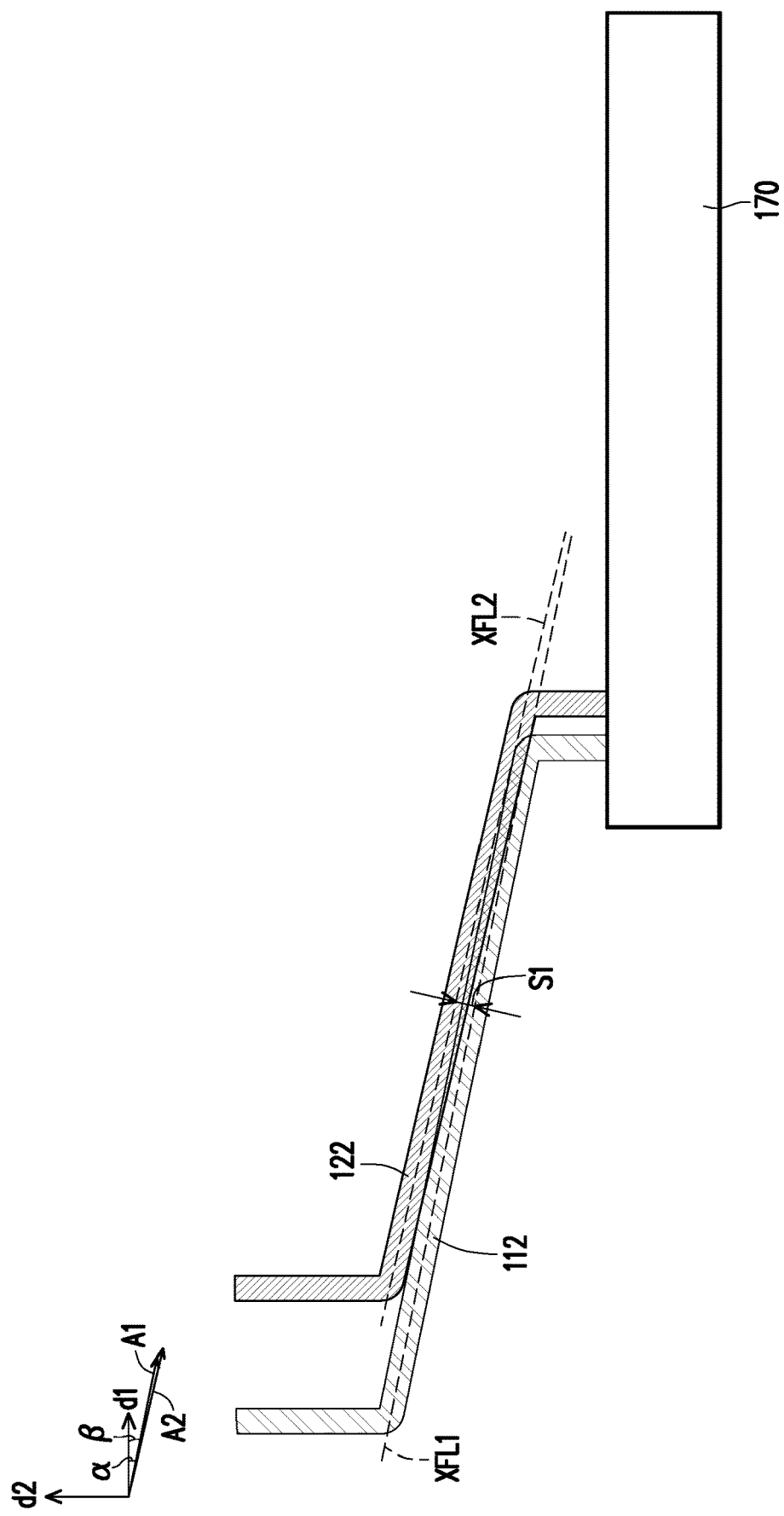
FIG. 1B shows a group of fan-out traces and a driving element of FIG. 1A.
Figure 1C:
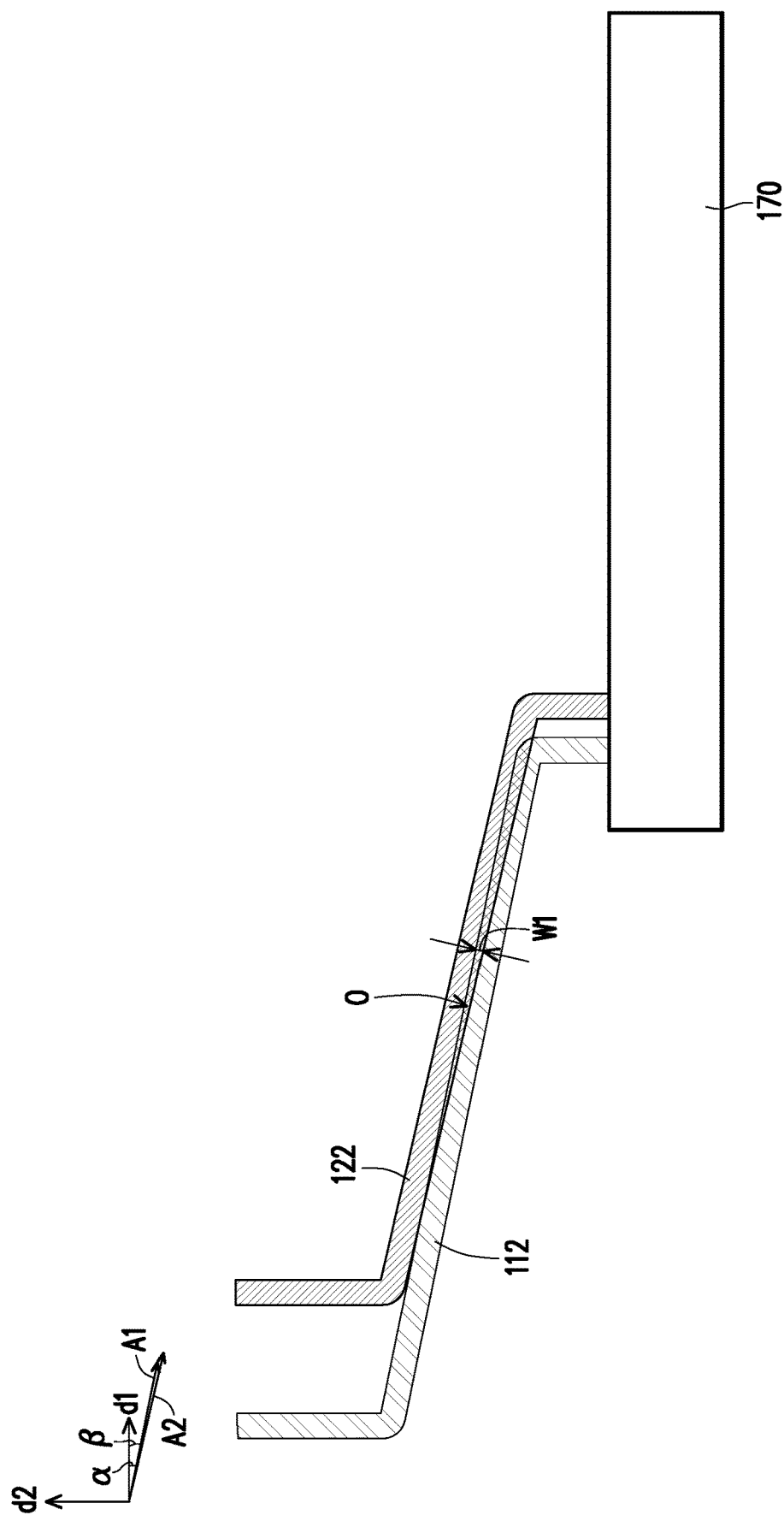
FIG. 1C shows a group of fan-out traces and the driving element of FIG. 1A.

FIG. 1A is a schematic top view of a pixel array substrate according to a first embodiment of the disclosure. FIG. 1B and FIG. 1C show a group of fan-out traces and a driving element of FIG. 1A.

Referring to FIG. 1A, a pixel array substrate 10 includes a substrate 100. The substrate 100 is mainly used to carry components of the pixel array substrate 10. For example, in the present embodiment, a material of the substrate 100 may be glass, quartz, an organic polymer, or an opaque/reflective material (e.g., an electrically conductive material, wafer, ceramic, or other applicable material), or other applicable material.

The pixel array substrate 10 further includes a sealant 180 disposed on the substrate 100. For example, in the present embodiment, the pixel array substrate 10 further includes an alignment film (not shown). The alignment film is disposed on the components of the pixel array substrate 10 other than the sealant 180, and the sealant 180 is disposed on the alignment film. In the present embodiment, the sealant 180 may be a photocurable adhesive, or a combination of a photocurable adhesive and a thermally curable adhesive.

The substrate 100 has a first area 100a and a second area 100b outside the first area 100a. The first area 100a is located within a vertical projection of the sealant 180 on the substrate 100, and the second area 100b is located on and outside the vertical projection of the sealant 180 on the substrate 100.

The pixel array substrate 10 further includes a plurality of signal lines SL1, a plurality of signal lines SL2, and a plurality of pixel structures PX, disposed on the first area 100a of the substrate 100. The pixel structure PX may include an active device T and a pixel electrode E electrically connected to the active device T. For example, in the present embodiment, the active device T includes a thin film transistor having a source S, a gate G and a drain D, and the pixel electrode E is electrically connected to the drain D of the thin film transistor. The signal lines SL1 are arranged in an arranging direction d1, and the signal lines SL2 are arranged in an arranging direction d2, wherein the arranging direction d1 intersects the arranging direction d2. For example, in the present embodiment, the arranging direction d1 and the arranging direction d2 are selectively perpendicular to each other. However, the disclosure is not limited thereto.

The pixel structures PX are electrically connected to the signal lines SL1 and the signal lines SL2. For example, in the present embodiment, the source S of the active device T of the pixel structure PX is electrically connected to the signal line SL1, and the gate G of the active device T of the pixel structure PX is electrically connected to the signal line SL2. That is, in the present embodiment, the signal line SL1 may be a data line, and the signal line SL2 may be a scan line. However, the disclosure is not limited thereto.

The pixel array substrate 10 further includes a driving element 170 disposed on the second area 100b of the substrate 100 and located outside the vertical projection of the sealant 180 on the substrate 100. For example, in the present embodiment, the driving element 170 includes an integrated circuit (IC). However, the disclosure is not limited thereto. In the present embodiment, the driving element 170 has a central axis 170X, and an extension direction (e.g., but not limited to, the arranging direction d2) of the central axis 170X intersects the arranging direction d1 of the signal lines SL1.

The pixel array substrate 10 further includes a plurality of fan-out traces FL1 and FL2 disposed on the substrate 100. Specifically, in the present embodiment, a plurality of vertical projections of the fan-out traces FL1 and FL2 on the substrate 100 may be located between a plurality of vertical projections of the pixel structures PX on the substrate 100 and a vertical projection of the driving element 170 on the substrate 100. Each of the fan-out traces FL1 and FL2 is electrically connected to one of the signal lines SL1 and SL2 and the driving element 170.

In the present embodiment, an exemplary example is given in which each of the fan-out traces FL1 and FL2 is electrically connected to a corresponding one of the signal lines SL1. However, the disclosure is not limited thereto. In another embodiment, the fan-out traces FL1 and FL2 may be electrically connected to a plurality of signal lines SL1 and a plurality of signal lines SL2; in still another embodiment, each of the fan-out traces FL1 and FL2 may be electrically connected to a corresponding one of the signal lines SL2.

The fan-out traces FL1 and FL2 include at least one fan-out trace group GP. Each fan-out trace group GP includes a first fan-out trace FL1 and a second fan-out trace FL2. In the present embodiment, in the same fan-out trace group GP, the first fan-out trace FL1 and the second fan-out trace FL2 may be respectively formed in two different conductive layers, and an insulating layer is provided between the two conductive layers. However, the disclosure is not limited thereto. In the present embodiment, the fan-out traces FL1 and FL2 may include a plurality of fan-out trace groups GP, a plurality of first fan-out traces FL1 and a plurality of second fan-out traces FL2 of the fan-out trace groups GP are roughly alternately arranged in the arranging direction d1, and the first fan-out trace FL1 and the second fan-out trace FL2 of the same fan-out trace group GP partially overlap.

For example, in the present embodiment, a first fan-out trace FL1 has an end part 111, a main portion 112 and an end part 113. The end part 111 of the first fan-out trace FL1 is connected to the driving element 170, the main portion 112 of the first fan-out trace FL1 is connected to the end part 111 of the first fan-out trace FL1, the end part 113 of the first fan-out trace FL1 is connected to the main portion 112 of the first fan-out trace FL1, and a signal line SL1 corresponding to the first fan-out trace FL1 is connected to the end part 113 of the first fan-out trace FL1. A second fan-out trace FL2 has an end part 121, a main portion 122 and an end part 123. The end part 121 of the second fan-out trace FL2 is connected to the driving element 170, the main portion 122 of the second fan-out trace FL2 is connected to the end part 121 of the second fan-out trace FL2, the end part 123 of the second fan-out trace FL2 is connected to the main portion 122 of the second fan-out trace FL2, and another signal line SL1 corresponding to the second fan-out trace FL2 is connected to the end part 123 of the second fan-out trace FL2.

In the present embodiment, an extension direction of the end part 111 of the first fan-out trace FL1 and an extension direction of the end part 121 of the second fan-out trace FL2 are roughly parallel to the arranging direction d2, and the end parts 111 of the first fan-out traces FL1 and the end parts 121 of the second fan-out traces FL2 are alternately arranged in the arranging direction d1. That is, the end parts 111 of the first fan-out traces FL1 and the end parts 121 of the second fan-out traces FL2 may not overlap.

On the other hand, in the present embodiment, an extension direction of the end part 113 of the first fan-out trace FL1 and an extension direction of the end part 123 of the second fan-out trace FL2 are roughly parallel to the arranging direction d2, and the end parts 113 of the first fan-out traces FL1 and the end parts 123 of the second fan-out traces FL2 are alternately arranged in the arranging direction d1. That is, the end parts 113 of the first fan-out traces FL1 and the end parts 123 of the second fan-out traces FL2 may not overlap.

In the same fan-out trace group GP, at least a portion of the main portion 112 of the first fan-out trace FL1 and at least a portion of the main portion 122 of the second fan-out trace FL2 are located in the second area 100b and partially overlap. The main portion 112 of the first fan-out trace FL1 extends in a first direction A1, and the first direction A1 and the arranging direction d1 have a first angle α (e.g., an acute angle) therebetween. The main portion 121 of the second fan-out trace FL2 extends in a second direction A2, and the second direction A2 and the arranging direction d1 have a second angle β (e.g., an acute angle) therebetween. The first angle α is different from the second angle β. That is, a degree of inclination of the main portion 112 of the first fan-out trace FL1 is different from a degree of inclination of the main portion 122 of the second fan-out trace FL2. For example, in the present embodiment, the first angle α and the second angle β may satisfy: $0.001° < |α-β| < 5°$.

Referring to FIG. 1A and FIG. 1B, from another perspective, the main portion 112 of the first fan-out trace FL1 has a first central axis XFL1 coincident with the first direction A1, the main portion 122 of the second fan-out trace FL2 has a second central axis XFL2 coincident with the second direction A2, and a distance S1 between the first central axis XFL1 and the second central axis XFL2 increases as being away from the driving element 170. Referring to FIG. 1A and FIG. 1C, from still another perspective, the main portion 112 of the first fan-out trace FL1 and the main portion 121 of the second fan-out trace FL2 have an overlapping area O therebetween, and a width W1 of the overlapping area O decreases as being away from the driving element 170.

Specifically, in the present embodiment, a portion of the main portion 112 of the first fan-out trace FL1 that is close to the driving element 170 and a portion of the main portion 122 of the second fan-out trace FL2 that is close to the driving element 170 overlap each other. A portion of the main portion 112 of the first fan-out trace FL1 that is close to the pixel structure PX and a portion of the main portion 122 of the second fan-out trace FL2 that is close to the pixel structure PX are offset from each other. The sealant 180 is roughly disposed on the overlapping area O (denoted in FIG. 1C) between the main portion 112 of the first fan-out trace FL1 and the main portion 122 of the second fan-out trace FL2. The sealant 180 is roughly not disposed on an area where the main portion 112 of the first fan-out trace FL1 and the main portion 122 of the second fan-out trace FL2 are completely offset from each other.

That is, since the extension direction A1 of the main portion 112 of the first fan-out trace FL1 is different from the extension direction A2 of the main portion 122 of the second fan-out trace FL2, the sealant 180 may be mostly disposed on the overlapping area O between the first fan-out trace FL1 and the second fan-out trace FL2. That is, a higher proportion of the sealant 180 will not be covered by the fan-out traces FL1 and FL2. Accordingly, in a manufacturing process of a display panel (not shown) including the pixel array substrate 10, the sealant 180 can receive more light beams, thereby improving a curing rate of the sealant 180.

In addition, since a portion of the first fan-out trace FL1 overlaps a portion of the second fan-out trace FL2 and another portion of the first fan-out trace FL1 does not overlap another portion of the second fan-out trace FL2, a parasitic capacitance between the first fan-out trace FL1 and the second fan-out trace FL2 is low, which helps improve electrical properties of the pixel array substrate 10. In short, the display panel using the pixel array substrate 10 of the present embodiment has a slim border, a low parasitic capacitance and a high sealant curing rate simultaneously.

Figure 2A:
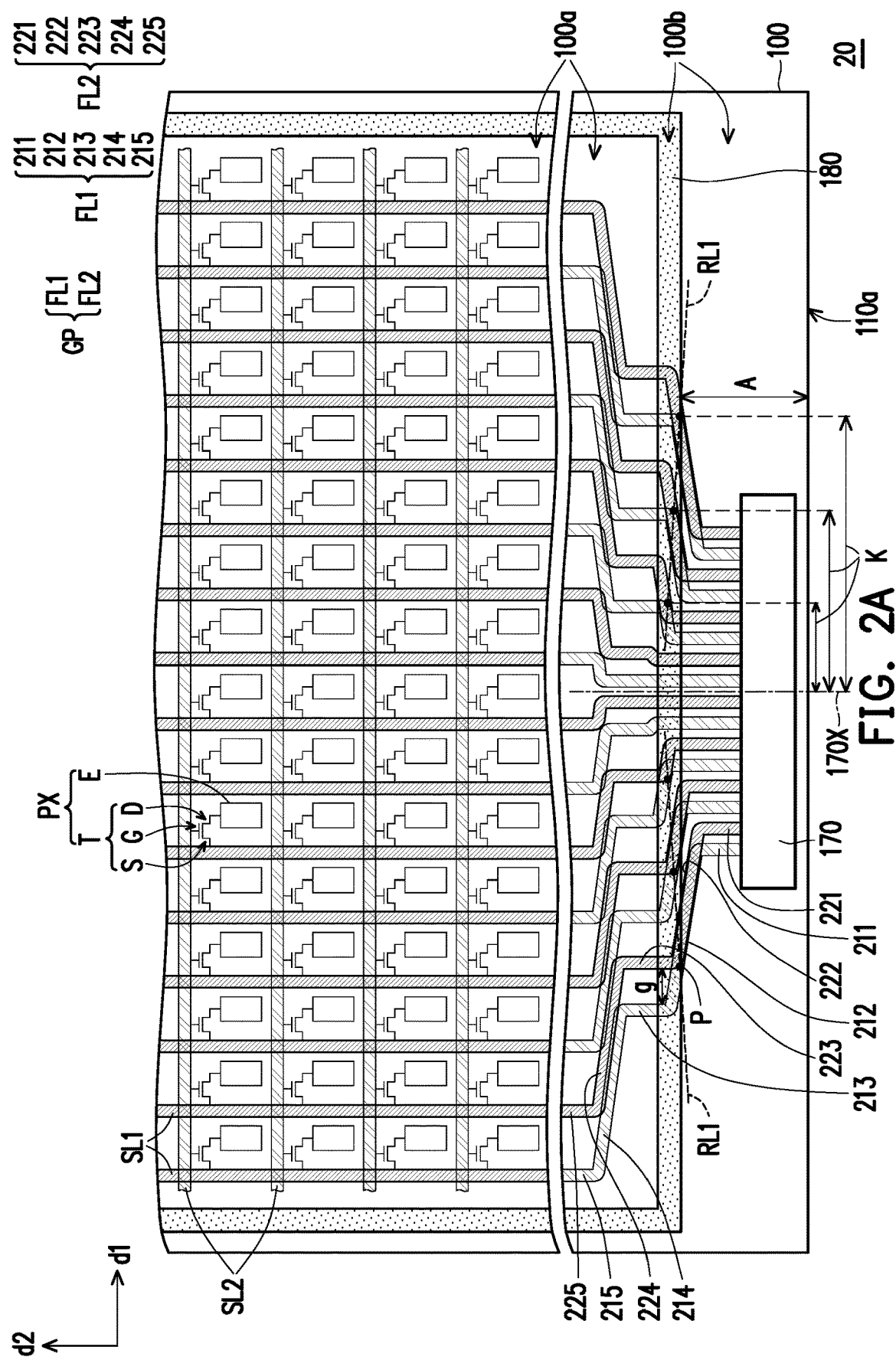
FIG. 2A is a schematic top view of a pixel array substrate according to a second embodiment of the disclosure.

FIG. 2A is a schematic top view of a pixel array substrate according to a second embodiment of the disclosure. Referring to FIG. 2A, a pixel array substrate 20 includes the substrate 100, a plurality of signal lines SL1 and SL2, a plurality of pixel structures PX, the driving element 170, and a plurality of fan-out traces FL1 and FL2. The signal lines SL1 and SL2 are disposed on the substrate 100. The signal lines SL1 are arranged in the arranging direction d1. The pixel structures PX are electrically connected to the signal lines SL1 and SL2. The driving element 170 is disposed on the substrate 100. Each of the fan-out traces FL1 and FL2 is electrically connected to one of the signal lines SL1 and SL2 and the driving element 170. The fan-out traces FL1 and FL2 include a plurality of fan-out trace groups GP. Each of the fan-out trace groups GP includes a first fan-out trace FL1 and a second fan-out trace FL2. The first fan-out trace FL1 and the second fan-out trace FL2 of the same fan-out trace group GP partially overlap.

In the present embodiment, the first fan-out trace FL1 has a portion 211, a portion 212, a portion 213, a portion 214 and a portion 215 sequentially arranged and sequentially connected to one another from the driving element 170 toward a corresponding one of the signal lines SL1. For example, in the present embodiment, the portion 211, the portion 213 and the portion 215 of the first fan-out trace FL1 may roughly extend in the arranging direction d2; an extension direction of the portion 212 and the portion 214 of the first fan-out trace FL1 intersects the arranging direction d1 and the arranging direction d2. Similarly, in the present embodiment, the second fan-out trace FL2 has a portion 221, a portion 222, a portion 223, a portion 224 and a portion 225 sequentially arranged and sequentially connected to one another from the driving element 170 toward another corresponding one of the signal lines SL1. For example, in the present embodiment, the portion 221, the portion 223 and the portion 225 of the second fan-out trace FL2 may roughly extend in the arranging direction d2; an extension direction of the portion 222 and the portion 224 of the second fan-out trace FL2 intersects the arranging direction d1 and the arranging direction d2.

For example, in the present embodiment, the portion 211 of the first fan-out trace FL1 and the portion 221 of the second fan-out trace FL2 are offset from each other. The portion 212 of the first fan-out trace FL1 and the portion 222 of the second fan-out trace FL2 may completely overlap. The portion 213 of the first fan-out trace FL1 and the portion 223 of the second fan-out trace FL2 are offset from each other. That is, a vertical projection of the portion 213 of the first fan-out trace FL1 on the substrate 100 and a vertical projection of the portion 223 of the second fan-out trace FL2 on the substrate 100 have a gap (or light transmissive area) g therebetween. The portion 214 of the first fan-out trace FL1 and the portion 224 of the second fan-out trace FL2 may partially overlap. The portion 215 of the first fan-out trace FL1 and the portion 225 of the second fan-out trace FL2 may be offset from each other.

In the present embodiment, the portion 211, the portion 212, the portion 213, the portion 214 and the portion 215 of the first fan-out trace FL1 are selectively formed in a first conductive layer, and the portion 221, the portion 222, the portion 223, the portion 224 and the portion 225 of the second fan-out trace FL2 are selectively formed in a second conductive layer, wherein an insulating layer (not shown) is provided between the first conductive layer and the second conductive layer.

It is worth noting that in each fan-out trace group GP, the portion 212 of the first fan-out trace FL1 and the portion 213 of the first fan-out trace FL1 have a junction point P therebetween. The junction point P may also be regarded as a branch point where the first fan-out trace FL1 and the second fan-out trace FL2 of the same fan-out trace group GP branch. At least a portion of a line RL1 connecting the junction points P of the first fan-out traces FL1 of the fan-out trace groups GP is not parallel to the arranging direction d1.

From another perspective, the driving element 170 has a central axis 170X, and a distance K between each of the junction points P and the central axis 170X of the driving element 170 in the arranging direction d1 increases as the each of the junction points P approaches the driving element 170. That is, a distance A between each of the junction points P and an edge 110a of the substrate 110 in the arranging direction d2 increases as the each of the intersection points P approaches the central axis 170X of the driving element 170.

The pixel array substrate 20 further includes the sealant 180 disposed at the gaps g of the fan-out trace groups GP. That is, a higher proportion of the sealant 180 will not be covered by the fan-out traces FL1 and FL2. Accordingly, in a manufacturing process of a display panel (not shown) including the pixel array substrate 20, the sealant 180 can receive more light beams, thereby improving the curing rate of the sealant 180.

In addition, since the portion 212 of the first fan-out trace FL1 overlaps the portion 222 of the second fan-out trace FL2 and the portion 213 of the first fan-out trace FL1 does not overlap the portion 223 of the second fan-out trace FL2, a parasitic capacitance between the first fan-out trace FL1 and the second fan-out trace FL2 is low, which helps improve electrical properties of the pixel array substrate 20. In short, the display panel using the pixel array substrate 20 of the present embodiment has a slim border, a low parasitic capacitance and a high sealant curing rate simultaneously.

Figure 2B:
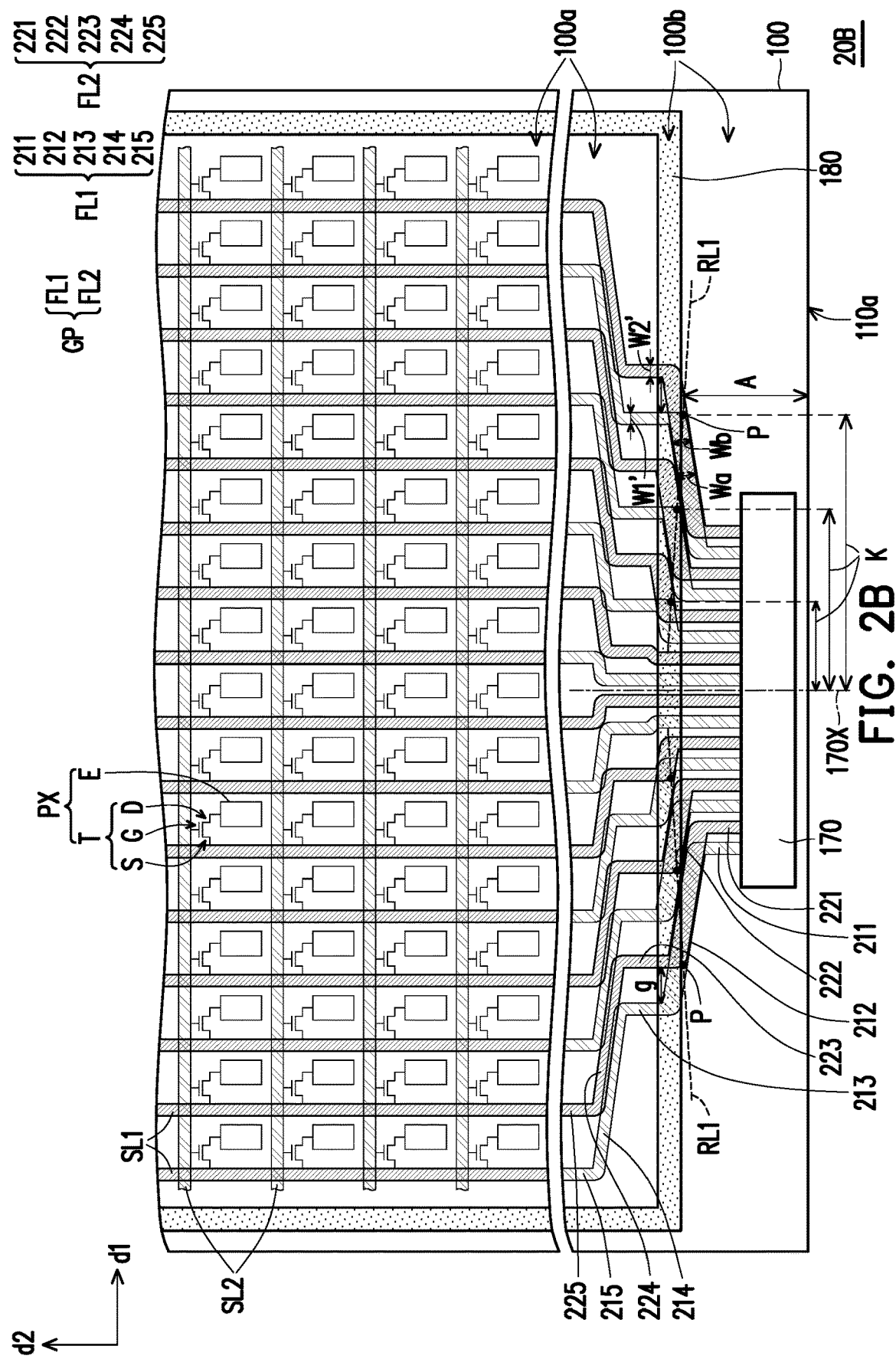
FIG. 2B is a schematic top view of a pixel array substrate according to another embodiment of the disclosure.

FIG. 2B is a schematic top view of a pixel array substrate according to another embodiment of the disclosure. A pixel array substrate 20B of FIG. 2B is similar to the pixel array substrate 20 of FIG. 2A, and a difference between the two is that, in the embodiment of FIG. 2B, a width Wa of the portion 212 of the first fan-out trace FL1 is larger than a width W1' of the portion 213 of the first fan-out trace FL1, and a width Wb of the portion 222 of the second fan-out trace FL2 is larger than a width W2' of the portion 223 of the second fan-out trace FL2.

In the present embodiment, since the gap g is large enough, even if the width Wa of the portion 212 of the first fan-out trace FL1 is increased and/or the width Wb of the portion 222 of the second fan-out trace FL2 is increased, the amount of light received by the sealant 180 is still sufficient. In the case where the amount of light received by the sealant 180 is sufficient, by appropriately increasing the width Wa of the portion 212 of the first fan-out trace FL1 and/or the width Wb of the portion 222 of the second fan-out trace FL2, impedance of the first fan-out trace FL1 and/or impedance of the second fan-out trace FL2 can be easily reduced, which improves the electrical properties of the pixel array substrate 20.

Figure 3A:
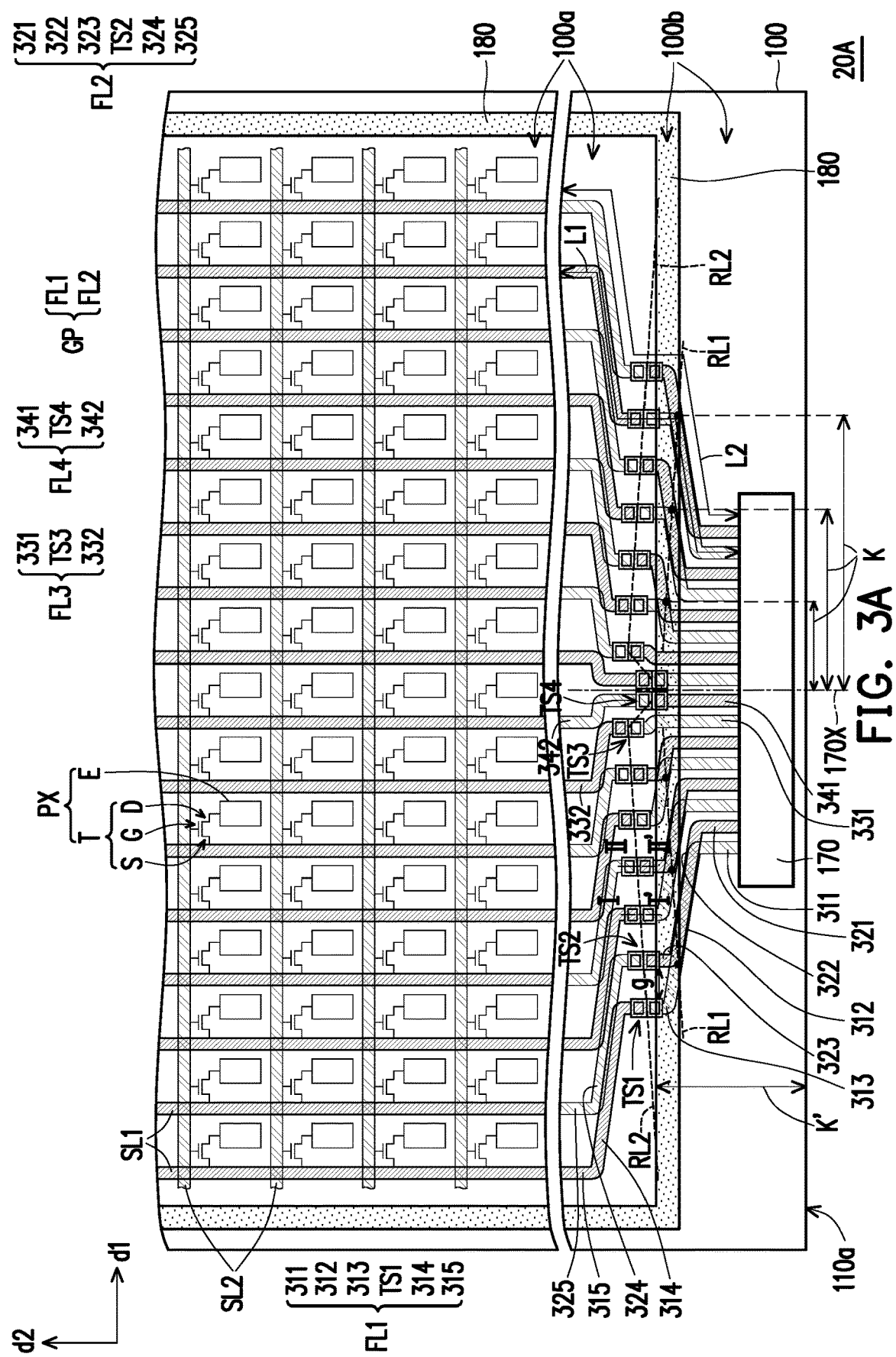
FIG. 3A is a schematic top view of a pixel array substrate according to a third embodiment of the disclosure.
Figure 3B:
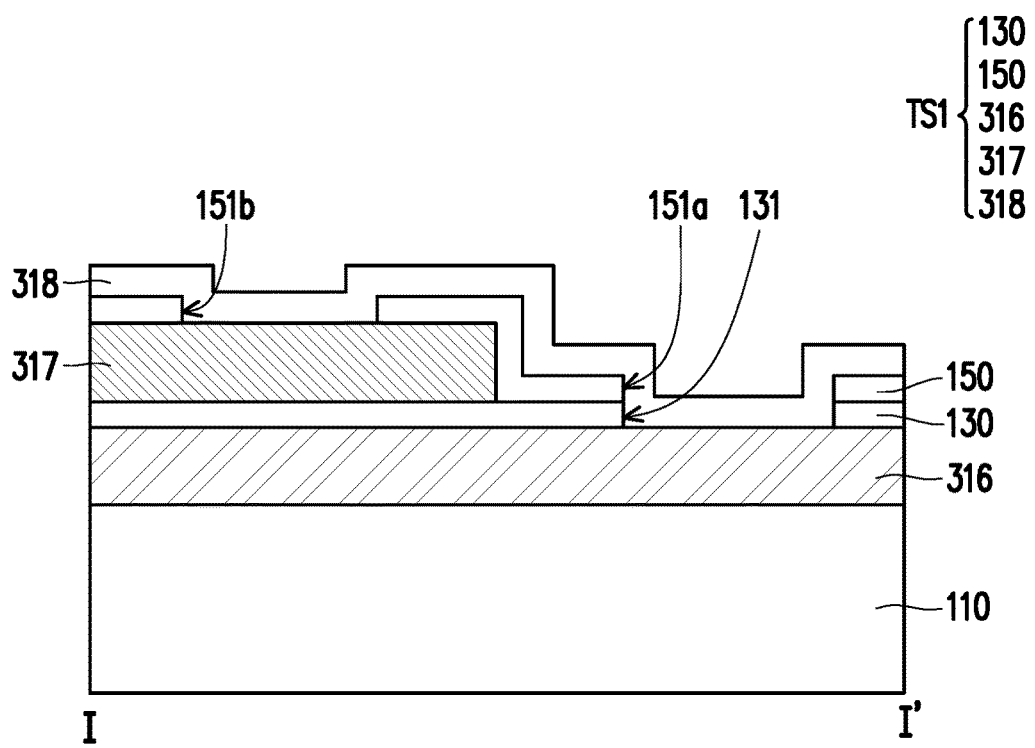
FIG. 3B is a schematic cross-sectional view of a transfer structure TS1 of FIG. 3A.
Figure 3C:
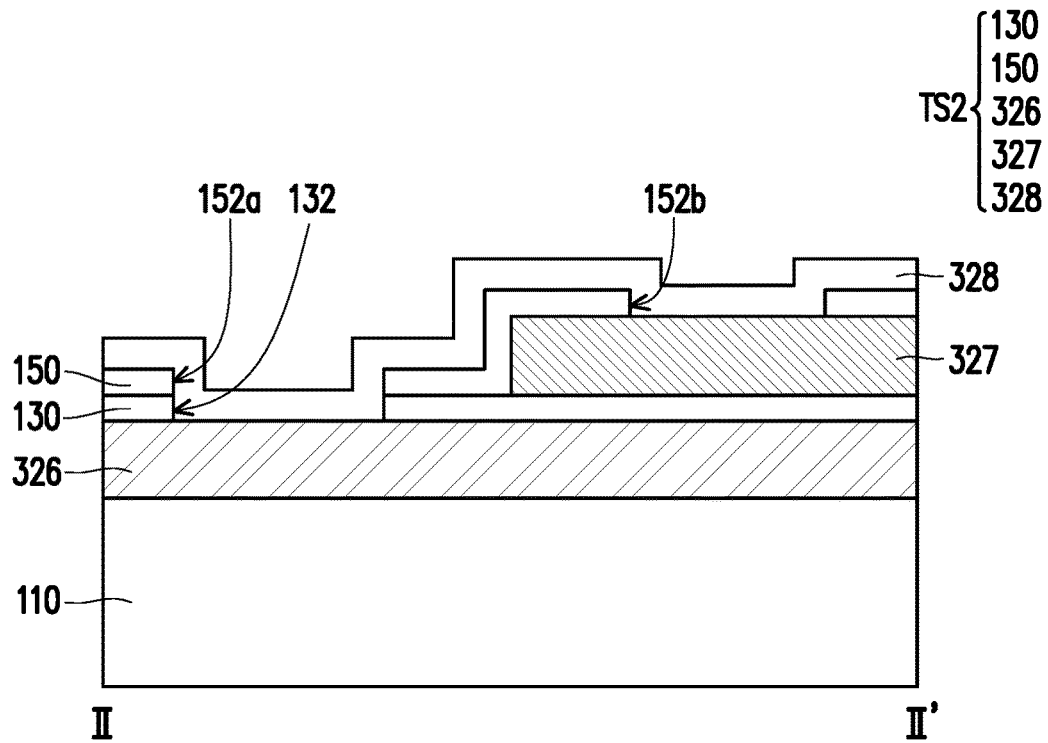
FIG. 3C is a schematic cross-sectional view of another transfer structure TS2 of FIG. 3A.

FIG. 3A is a schematic top view of a pixel array substrate according to a third embodiment of the disclosure. FIG. 3B is a schematic cross-sectional view of a transfer structure TS1 of FIG. 3A. FIG. 3C is a schematic cross-sectional view of another transfer structure TS2 of FIG. 3A.

Referring to FIG. 3A, a pixel array substrate 20A includes the substrate 100, a plurality of signal lines SL1 and SL2, a plurality of pixel structures PX, the driving element 170, and a plurality of fan-out traces FL1 and FL2. The signal lines SL1 and SL2 are disposed on the substrate 100. The signal lines SL1 are arranged in the arranging direction d1. The pixel structures PX are electrically connected to the signal lines SL1 and SL2. The driving element 170 is disposed on the substrate 100. Each of the fan-out traces FL1 and FL2 is electrically connected to one of the signal lines SL1 and SL2 and the driving element 170. The fan-out traces FL1 and FL2 include a plurality of fan-out trace groups GP. Each of the fan-out trace groups GP includes a first fan-out trace FL1 and a second fan-out trace FL2. The first fan-out trace FL1 and the second fan-out trace FL2 of the same fan-out trace group GP partially overlap.

In the present embodiment, the first fan-out trace FL1 has a portion 311, a portion 312, a portion 313, a first transfer structure TS1, a portion 314 and a portion 315 sequentially arranged and sequentially connected to one another from the driving element 170 toward a corresponding one of the signal lines SL1. For example, in the present embodiment, the portion 311 and the portion 315 of the first fan-out trace FL1 may roughly extend in the arranging direction d2; an extension direction of the portion 312 and the portion 314 of the first fan-out trace FL1 intersects the arranging direction d1 and the arranging direction d2. Similarly, in the present embodiment, the second fan-out trace FL2 has a portion 321, a portion 322, a portion 323, a second transfer structure TS2, a portion 324 and a portion 325 sequentially arranged and sequentially connected to one another from the driving element 170 toward another corresponding one of the signal lines SL1. For example, in the present embodiment, the portion 321 and the portion 325 of the second fan-out trace FL2 may roughly extend in the arranging direction d2; an extension direction of the portion 322 and the portion 324 of the second fan-out trace FL2 intersects the arranging direction d1 and the arranging direction d2.

For example, in the present embodiment, the portion 311 of the first fan-out trace FL1 and the portion 321 of the second fan-out trace FL2 are offset from each other. The portion 312 of the first fan-out trace FL1 and the portion 322 of the second fan-out trace FL2 may completely overlap. The portion 313 of the first fan-out trace FL1 and the portion 323 of the second fan-out trace FL2 are offset from each other. That is, a vertical projection of the portion 313 of the first fan-out trace FL1 on the substrate 100 and a vertical projection of the portion 323 of the second fan-out trace FL2 on the substrate 100 have the gap g therebetween. The portion 314 of the first fan-out trace FL1 and the portion 324 of the second fan-out trace FL2 may partially overlap. The portion 315 of the first fan-out trace FL1 and the portion 325 of the second fan-out trace FL2 may be offset from each other.

In the present embodiment, the portion 311, the portion 312 and the portion 313 of the first fan-out trace FL1 as well as the portion 324 and the portion 325 of the second fan-out trace FL2 are selectively formed in the first conductive layer, and the portion 314 and the portion 315 of the first fan-out trace FL1 as well as the portion 321, the portion 322 and the portion 323 of the second fan-out trace FL2 are selectively formed in the second conductive layer, wherein an insulating layer 130 (shown in FIG. 3B and FIG. 3C) is provided between the first conductive layer and the second conductive layer.

Unlike the second embodiment, in the present embodiment, the first fan-out trace FL1 of each fan-out trace group GP has the first transfer structure TS1 connected between the portion 312 of the first fan-out trace FL1 and the portion 314 of the first fan-out trace FL1. The second transfer structure TS2 of the second fan-out trace FL2 of each fan-out trace group GP is connected between the portion 322 of the second fan-out trace FL2 and the portion 324 of the second fan-out trace FL2. A line RL2 connecting the first transfer structures TS1 of the first fan-out traces FL1 of the fan-out trace groups GP and the second transfer structures TS2 of the second fan-out traces FL2 of the fan-out trace groups GP is not parallel to the arranging direction d1.

That is, in the present embodiment, the first transfer structures TS1 and the second transfer structures TS2 for transferring two different film layers (i.e., the aforesaid first and second conductive layers) are not located in the same horizontal line. The first transfer structures TS1 and the second transfer structures TS2 are not located in the middle of a border, but each first transfer structure TS1 may be substantially located at half a length L1 of the respective first fan-out traces FL1, and each second transfer structure TS2 may be substantially located at half a length L2 of the respective second fan-out traces FL2. Accordingly, the pixel array substrate 20A can also solve a problem of electrical matching of circuits.

Referring to FIG. 3A and FIG. 3B, in the present embodiment, the first transfer structure TS1 of the first fan-out trace FL1 includes a conductive pattern 316, a first insulating layer 130, a conductive pattern 317, a second insulating layer 150 and a bridge pattern 318. The conductive pattern 316 is directly connected to the portion 313 of the first fan-out trace FL1. The conductive pattern 316 of the first transfer structure TS1 and the portion 313 of the first fan-out trace FL1 may be formed in the same film layer. The conductive pattern 317 is directly connected to the portion 314 of the first fan-out trace FL1. The conductive pattern 317 of the first transfer structure TS1 and the portion 314 of the first fan-out trace FL1 may be formed in the same film layer. The first insulating layer 130 is disposed between the conductive pattern 316 and the conductive pattern 317. The second insulating layer 150 is disposed on the conductive pattern 317 and has at least one contact 151a and 151b.

The bridge pattern 318 is disposed on the second insulating layer 150 and is electrically connected to the conductive pattern 316 and the conductive pattern 317 via the at least one contact 151a and 151b of the second insulating layer 150. In the present embodiment, the bridge pattern 318 is electrically connected to the conductive pattern 316 via the contact 151a of the second insulating layer 150 and a contact 131 of the first insulating layer 130, wherein the contact 151a of the second insulating layer 150 is substantially alignable with the contact 131 of the first insulating layer 130; on the other hand, the bridge pattern 318 is electrically connected to the conductive pattern 317 via the contact 151b of the second insulating layer 150. In the present embodiment, the bridge pattern 318 and the pixel electrode E (denoted in FIG. 3A) are selectively formed in the same film layer. However, the disclosure is not limited thereto. According to other embodiments, the first transfer structure TS1 may be in other forms.

Referring to FIG. 3A and FIG. 3C, in the present embodiment, the second transfer structure TS2 of the second fan-out trace FL2 includes a conductive pattern 326, the first insulating layer 130, a conductive pattern 327, the second insulating layer 150 and a bridge pattern 328. The conductive pattern 326 is directly connected to the portion 323 of the second fan-out trace FL2. The conductive pattern 326 of the second transfer structure TS2 and the portion 323 of the second fan-out trace FL2 may be formed in the same film layer. The conductive pattern 327 is directly connected to the portion 324 of the second fan-out trace FL2. The conductive pattern 327 of the second transfer structure TS2 and the portion 324 of the second fan-out trace FL2 may be formed in the same film layer. The first insulating layer 130 is disposed between the conductive pattern 326 and the conductive pattern 327. The second insulating layer 150 is disposed on the conductive pattern 327 and has at least one contact 152a and 152b.

The bridge pattern 328 is disposed on the second insulating layer 150 and is electrically connected to the conductive pattern 326 and the conductive pattern 327 via the at least one contact 152a and 152b of the second insulating layer 150. In the present embodiment, the bridge pattern 328 is electrically connected to the conductive pattern 326 via the contact 152a of the second insulating layer 150 and a contact 132 of the first insulating layer 130, wherein the contact 152a of the second insulating layer 150 is substantially alignable with the contact 132 of the first insulating layer 130; on the other hand, the bridge pattern 328 is electrically connected to the conductive pattern 327 via the contact 152b of the second insulating layer 150. In the present embodiment, the bridge pattern 328 and the pixel electrode E (denoted in FIG. 3A) are selectively formed in the same film layer. However, the disclosure is not limited thereto. According to other embodiments, the second transfer structure TS2 may be in other forms.

Referring to FIG. 3A, in the present embodiment, the pixel array substrate 20A further includes a third fan-out trace FL3 and a fourth fan-out trace FL4, adjacent to each other and disposed between the fan-out trace groups GP and the central axis 170X of the driving element 170.

The third fan-out trace FL3 has a portion 331 and a portion 341 respectively belonging to two different film layers. For example, the portion 331 of the third fan-out trace FL3 belongs to the same film layer as the portions 311, 312 and 313 of the first fan-out trace FL1, and the portion 332 of the third fan-out trace FL3 belongs to the same film layer as the portions 314 and 315 of the first fan-out trace FL1. However, the disclosure is not limited thereto. The third fan-out trace FL3 further has a third transfer structure TS3 connected between the portion 331 of the third fan-out trace FL3 and the portion 332 of the third fan-out trace FL3. The third transfer structure TS3 substantially has the same structure as the first transfer structure TS1. A connection manner between the third transfer structure TS3 and the portions 331 and 332 of the third fan-out trace FL3 is substantially the same as a connection manner between the first transfer structure TS1 and the portions 313 and 314 of the first fan-out trace FL1. Therefore, illustration and description thereof will not be repeated.

The fourth fan-out trace FL4 has a portion 341 and a portion 342 respectively belonging to two different film layers. For example, the portion 341 of the fourth fan-out trace FL4 belongs to the same film layer as the portions 321, 322 and 323 of the second fan-out trace FL2, and the portion 342 of the fourth fan-out trace FL4 belongs to the same film layer as the portions 324 and 325 of the second fan-out trace FL2. However, the disclosure is not limited thereto. The fourth fan-out trace FL4 further has a fourth transfer structure TS4 connected between the portion 341 of the fourth fan-out trace FL4 and the portion 342 of the fourth fan-out trace FL4. The fourth transfer structure TS4 substantially has the same structure as the second transfer structure TS2. A connection manner between the fourth transfer structure TS4 and the portions 341 and 342 of the fourth fan-out trace FL4 is substantially the same as a connection manner between the second transfer structure TS2 and the portions 323 and 324 of the second fan-out trace FL2. Therefore, illustration and description thereof will not be repeated.

It is worth noting that in the present embodiment, the line RL2 connecting the first transfer structures TS1 and the second transfer structures TS2 of the fan-out trace groups GP, the third transfer structure TS3 of the third fan-out trace FL3 and the fourth transfer structure TS4 of the fourth fan-out trace FL4 is at a distance K' from the edge 110a of the substrate 110, the distance K' increasing and then decreasing as approaching the central axis 170X of the driving element 170.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A pixel array substrate, comprising:
a substrate, having a first area and a second area outside the first area;
a sealant, disposed on the substrate, wherein the first area is located within a vertical projection of the sealant on the substrate, and the second area is located on and outside the vertical projection of the sealant on the substrate;
a plurality of signal lines, disposed on the first area of the substrate, wherein at least some of the plurality of signal lines are arranged in an arranging direction;
a plurality of pixel structures, disposed on the first area of the substrate and electrically connected to the plurality of signal lines;
a driving element, disposed on the second area of the substrate; and
a plurality of fan-out traces, wherein each of the plurality of fan-out traces is electrically connected to one of the plurality of signal lines and the driving element; wherein
the plurality of fan-out traces comprise at least one fan-out trace group, each of the at least one fan-out trace group comprising a first fan-out trace and a second fan-out trace;
the first fan-out trace has a main portion, and the second fan-out trace has a main portion, wherein at least a portion of the main portion of the first fan-out trace and at least a portion of the main portion of the second fan-out trace are located in the second area and partially overlap;
the main portion of the first fan-out trace extends in a first direction having a first angle α with respect to the arranging direction, the main portion of the second fan-out trace extends in a second direction having a second angle β with respect to the arranging direction, and the first angle α is different from the second angle β.

2. The pixel array substrate of claim 1, wherein the main portion of the first fan-out trace has a first central axis coincident with the first direction, the main portion of the second fan-out trace has a second central axis coincident with the second direction, and a distance between the first central axis and the second central axis increases as being away from the driving element.

3. The pixel array substrate of claim 1, wherein the main portion of the first fan-out trace and the main portion of the second fan-out trace have an overlapping area therebetween, and a width of the overlapping area decreases as being away from the driving element.

4. The pixel array substrate of claim 1, further comprising:
an insulating layer, disposed between the first fan-out trace and the second fan-out trace.

5. The pixel array substrate of claim 1, wherein the first angle α and the second angle β satisfy: $0.001°<|\alpha-\beta|<5°$.

6. A pixel array substrate, comprising:
a substrate;
a plurality of signal lines, disposed on the substrate, at least some of the plurality of signal lines being arranged in an arranging direction;
a plurality of pixel structures electrically connected to the plurality of signal lines;
a driving element, disposed on the substrate; and
a plurality of fan-out traces, wherein each of the plurality of fan-out traces is electrically connected to one of the plurality of signal lines and the driving element; wherein
the plurality of fan-out traces comprise a plurality of fan-out trace groups, each of the plurality of fan-out trace groups comprising a first fan-out trace and a second fan-out trace;
the first fan-out trace has a first portion and a second portion, and the second fan-out trace has a first portion and a second portion, wherein the first portion of the first fan-out trace overlaps the first portion of the second fan-out trace, a vertical projection of the second portion of the first fan-out trace on the substrate and a vertical projection of the second portion of the second fan-out trace on the substrate have a gap therebetween, and the first portion of the first fan-out trace and the second portion of the first fan-out trace have a junction point therebetween;

at least a portion of a line connecting the junction points of the first fan-out traces of the plurality of fan-out trace groups is not parallel to the arranging direction.

7. The pixel array substrate of claim 6, further comprising:
a sealant, disposed at the gaps of the plurality of fan-out trace groups.

8. The pixel array substrate of claim 6, wherein the driving element has a central axis, and a distance between each of the intersection points and the central axis of the driving element in the arranging direction increases as the each of the intersection points approaches the driving element.

9. The pixel array substrate of claim 6, further comprising:
an insulating layer, disposed between the first fan-out trace and the second fan-out trace.

10. The pixel array substrate of claim 6, wherein a width of the first portion of the first fan-out trace is larger than a width of the second portion of the first fan-out trace.

11. The pixel array substrate of claim 6, wherein a width of the first portion of the second fan-out trace is larger than a width of the second portion of the second fan-out trace.

12. The pixel array substrate of claim 6, wherein the first fan-out trace further has a third portion, and the first portion of the first fan-out trace and the third portion of the first fan-out trace respectively belong to two different film layers; the first fan-out trace further has a first transfer structure connected between the first portion of the first fan-out trace and the third portion of the first fan-out trace; and a line connecting the first transfer structures of the first fan-out traces of the plurality of fan-out trace groups is not parallel to the arranging direction.

13. The pixel array substrate of claim 12, wherein the second fan-out trace further has a third portion, and the first portion of the second fan-out trace and the third portion of the second fan-out trace respectively belong to two different film layers; the second fan-out trace further has a second transfer structure connected between the first portion of the second fan-out trace and the third portion of the second fan-out trace; and a line connecting the first transfer structures of the first fan-out traces of the plurality of fan-out trace groups and the second transfer structures of the second fan-out traces of the plurality of fan-out trace groups is not parallel to the arranging direction.

14. The pixel array substrate of claim 13, wherein the first transfer structure is located at half a length of the first fan-out trace.

15. The pixel array substrate of claim 13, wherein the second transfer structure is located at half a length of the second fan-out trace.

16. The pixel array substrate of claim 13, wherein the driving element has a central axis, and the plurality of fan-out traces further comprise:
a third fan-out trace and a fourth fan-out trace, adjacent to each other and disposed between the plurality of fan-out trace groups and the central axis; wherein
the third fan-out trace has a first portion and a second portion respectively belonging to two different film layers;
the third fan-out trace further has a third transfer structure connected between the first portion of the third fan-out trace and the second portion of the third fan-out trace;
the fourth fan-out trace has a first portion and a second portion respectively belonging to two different film layers;
the fourth fan-out trace further has a fourth transfer structure connected between the first portion of the fourth fan-out trace and the second portion of the fourth fan-out trace;
the line connecting the first transfer structures, the second transfer structures, the third transfer structure and the fourth transfer structure is at a distance from an edge of the substrate, the distance increasing and then decreasing as approaching the central axis of the driving element.

* * * * *